(12) United States Patent
Lin et al.

(10) Patent No.: US 12,133,343 B2
(45) Date of Patent: Oct. 29, 2024

(54) DISPLAY DEVICE

(71) Applicant: AUO Corporation, Hsinchu (TW)

(72) Inventors: Chung Tan Lin, Hsinchu (TW);
Hsu-Sheng Hsu, Hsinchu (TW);
Ching-Sheng Cheng, Hsinchu (TW)

(73) Assignee: AUO Corporation, Hsinchu (TW)

( * ) Notice: Subject to any disclaimer, the term of this patent is extended or adjusted under 35 U.S.C. 154(b) by 172 days.

(21) Appl. No.: 17/994,406

(22) Filed: Nov. 28, 2022

(65) Prior Publication Data
US 2024/0015903 A1    Jan. 11, 2024

(30) Foreign Application Priority Data
Jul. 8, 2022    (TW) .................................. 111125818

(51) Int. Cl.
*H05K 5/02*    (2006.01)
*G04B 19/04*    (2006.01)

(52) U.S. Cl.
CPC ............... *H05K 5/02* (2013.01); *G04B 19/04* (2013.01)

(58) Field of Classification Search
CPC ........................... H05K 5/0017; H05K 5/0217
USPC ....................................................... 361/807
See application file for complete search history.

(56) References Cited

U.S. PATENT DOCUMENTS

| | | | |
|---|---|---|---|
| 9,642,241 B2 | 5/2017 | Huitema et al. | |
| 11,508,798 B2 | 11/2022 | Saitoh et al. | |
| 2011/0182151 A1* | 7/2011 | Geyer | G04G 9/04 |
| | | | 368/68 |
| 2016/0081180 A1 | 3/2016 | Huitema et al. | |
| 2017/0131846 A1* | 5/2017 | Huitema | G06F 3/0421 |
| 2021/0020728 A1 | 1/2021 | Saitoh et al. | |
| 2022/0390898 A1* | 12/2022 | Willemin | G04B 45/0015 |

FOREIGN PATENT DOCUMENTS

| | | | | |
|---|---|---|---|---|
| CN | 206347394 | | 7/2017 | |
| CN | 111837455 | | 10/2020 | |
| CN | 113093507 B | * | 9/2022 | ............ G04B 19/34 |
| TW | 201543665 | | 11/2015 | |

* cited by examiner

*Primary Examiner* — Hung S. Bui
(74) *Attorney, Agent, or Firm* — JCIPRNET

(57) ABSTRACT

A display device includes a bezel annular in shape and a flexible display panel. The flexible display panel includes a display area annular in shape and a pin bonding area connected to the display area. The display area is disposed above the front side of the bezel. The pin bonding area is bent from the front side of the bezel to the outer side of the bezel.

14 Claims, 11 Drawing Sheets

DISPLAY DEVICE

CROSS-REFERENCE TO RELATED APPLICATION

This application claims the priority benefit of Taiwan application serial no. 111125818, filed on Jul. 8, 2022. The entirety of the above-mentioned patent application is hereby incorporated by reference herein and made a part of this specification.

BACKGROUND

Technical Field

The disclosure relates to a display device.

Description of Related Art

With the development of science and technology, the appearance rate of display devices in the market is gradually increasing, and various related technologies are also emerging one after another. In order to increase the attractiveness of products to consumers, various manufacturers are committed to developing free form display devices. A free form display device is different from a traditional rectangular display device, and the variability in the appearance of the free form display device may attract the attention of consumers.

A common display device usually includes a bezel, a display panel on the bezel, and a circuit board connected to the display panel. Generally speaking, the circuit board of the display panel is hidden between the bezel and the display panel, thereby preventing the circuit board from adversely affecting the visual effect of the display device. At present, how the circuit board in the free form display device may be configured to avoid adversely affecting the visual effect of the display device is a topic that many manufacturers are working on.

SUMMARY

The disclosure provides a display device. A pin bonding area of a flexible display panel is bent from the front side of a bezel to the outer side of a bezel, so that other external components may be prevented from adversely affecting the visual effect of the display device.

At least one embodiment of the disclosure provides a display device. The display device includes a bezel annular in shape and a flexible display panel. The flexible display panel includes a display area annular in shape and a pin bonding area connected to the display area. The display area is disposed above the front side of the bezel. The pin bonding area is bent from the front side of the bezel to the outer side of the bezel.

DESCRIPTION OF THE EMBODIMENTS

Figure 1A:
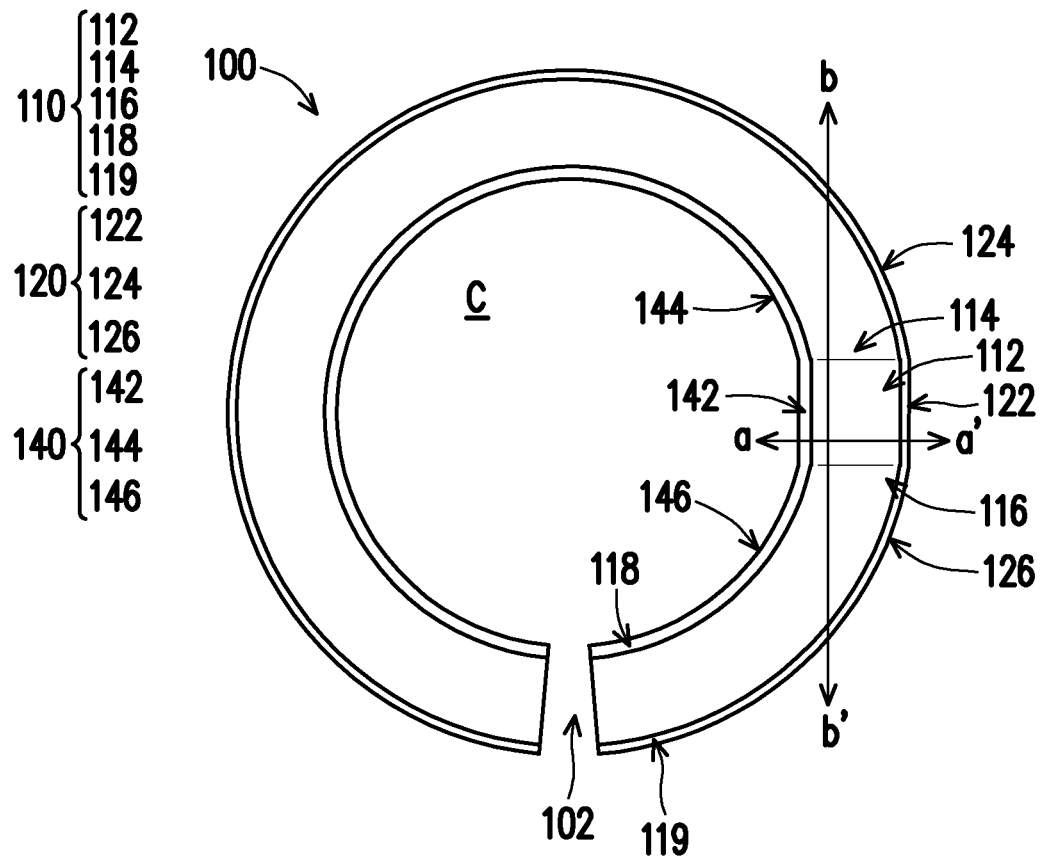
FIG. 1A is a schematic top view of a bezel according to an embodiment of the disclosure.
Figure 1B:
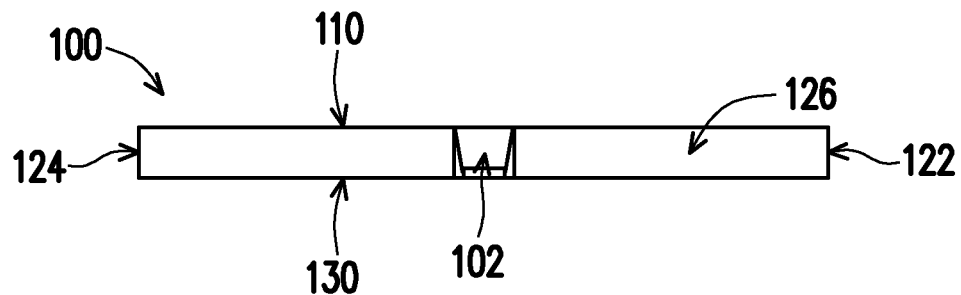
FIG. 1B is a schematic side view of a bezel according to an embodiment of the disclosure.
Figure 1C:
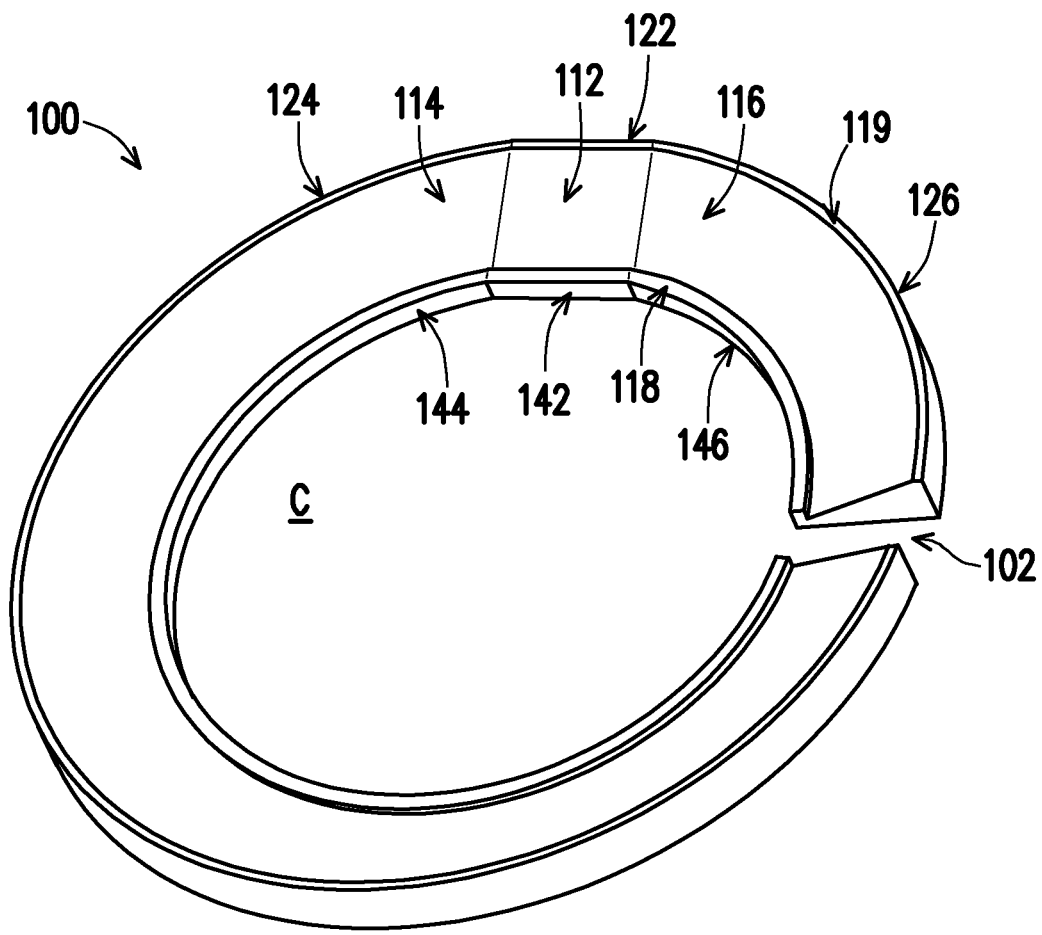
FIG. 1C is a schematic perspective view of a bezel according to an embodiment of the disclosure.
Figure 2A:
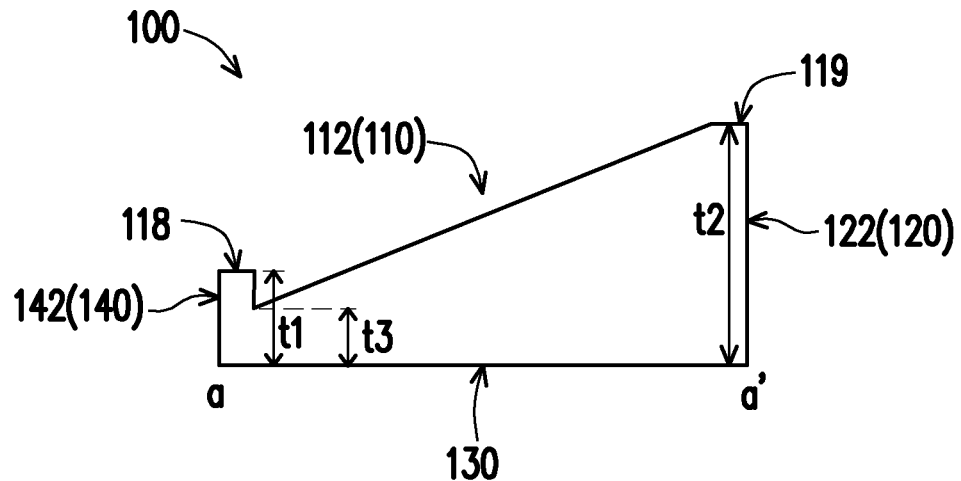
FIG. 2A is a schematic cross-sectional view along lines a-a' of FIG. 1A.
Figure 2B:
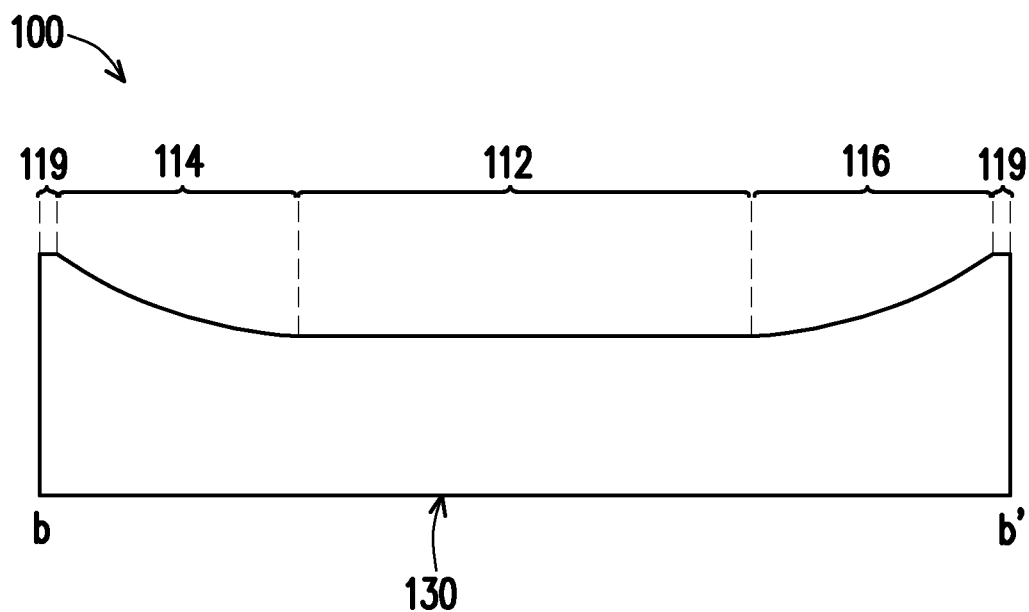
FIG. 2B is a schematic cross-sectional view along lines b-b' of FIG. 1A.

FIG. 1A is a schematic top view of a bezel according to an embodiment of the disclosure. FIG. 1B is a schematic side view of a bezel according to an embodiment of the disclosure. FIG. 1C is a schematic perspective view of a bezel according to an embodiment of the disclosure. FIG. 2A is a schematic cross-sectional view along lines a-a' of FIG. 1A. FIG. 2B is a schematic cross-sectional view along lines b-b' of FIG. 1A.

Please refer to FIG. 1A to FIG. 2B. The bezel 100 is annular in shape. In the embodiment, the bezel 100 is an annular shape which includes a first notch 102, but the disclosure is not limited hereto. In other embodiments, the bezel 100 is a closed annular shape. The bezel 100 includes a front side 110, an outer side 120, a back side 130, and an inner side 140. A thickness t1 of the inner side 140 of the bezel 100 is less than a thickness t2 of the outer side 120 of the bezel 100.

The front side 110 of the bezel 100 includes a first plane portion 112, a first curved plane portion 114, and a second curved plane portion 116. The first plane portion 112 is connected to the first curved plane portion 114 and the second curved plane portion 116. In the embodiment, the first plane portion 112 is connected between the first curved plane portion 114 and the second curved plane portion 116. The first plane portion 112, the first curved plane portion 114, and the second curved plane portion 116 surround an accommodating space C of the inner side 140 of the bezel 100. The accommodating space C communicates with the first notch 102. The first notch 102 is located between the first curved plane portion 114 and the second curved plane portion 116.

The front side 110 of the bezel 100 has a blocking wall 118 near the inner side 140. The blocking wall 118 protrudes upward, thereby preventing the components disposed on the front side 110 from slipping. There is a thickness t3 between the bottom of the blocking wall 118 and the back side 130 of the bezel 100. The height of the blocking wall 118 protruding from the front side 110 is approximately equal to the thickness t1 minus the thickness t3. The front side 110 of the bezel 100 has an annular plane 119 near the outer side 120. The annular plane 119 surrounds the first plane portion 112, the first curved plane portion 114, and the second curved plane portion 116.

In some embodiments, the first curved plane portion 114 and the second curved plane portion 116 are cubic planes. For example, the first curved plane portion 114 and the second curved plane portion 116 are each a partial conical plane of the same virtual cone (not shown). The virtual cone is wide at the top and narrow at the bottom. It may also be said that the virtual cone is wider near the annular plane 119 and narrower near the blocking wall 118.

The outer side 120 of the bezel 100 includes a first outer plane portion 122, a first outer curved plane portion 124, and a second outer curved plane portion 126. The first outer plane portion 122 is connected between the first outer curved plane portion 124 and the second outer curved plane portion 126. In the embodiment, the first outer plane portion 122, the first outer curved plane portion 124, and the second outer curved plane portion 126 are connected to the annular plane 119 of the front side 110 and the back side 130.

The inner side 140 of the bezel 100 includes a first inner plane portion 142, a first inner curved plane portion 144, and a second inner curved plane portion 146. The first inner plane portion 142 is connected between the first inner curved plane portion 144 and the second inner curved plane portion 146. In the embodiment, the first inner plane portion 142, the first inner curved plane portion 144, and the second inner curved plane portion 146 are connected to the blocking wall 118 of the front side 110 and the back side 130.

In some embodiments, the first plane portion 112, the first outer plane portion 122, and the first inner plane portion 142 are aligned with one another. The first curved plane portion 114, the first outer curved plane portion 124, and the first inner curved plane portion 144 are aligned with one another. The second curved plane portion 116, the second outer curved plane portion 126, and the second inner curved plane portion 146 are aligned with one another.

In some embodiments, the material of the bezel 100 includes a metal, a polymer material, a ceramic material, or other applicable materials. In some embodiments, the bezel 100 includes a rigid material.

Figure 3A:
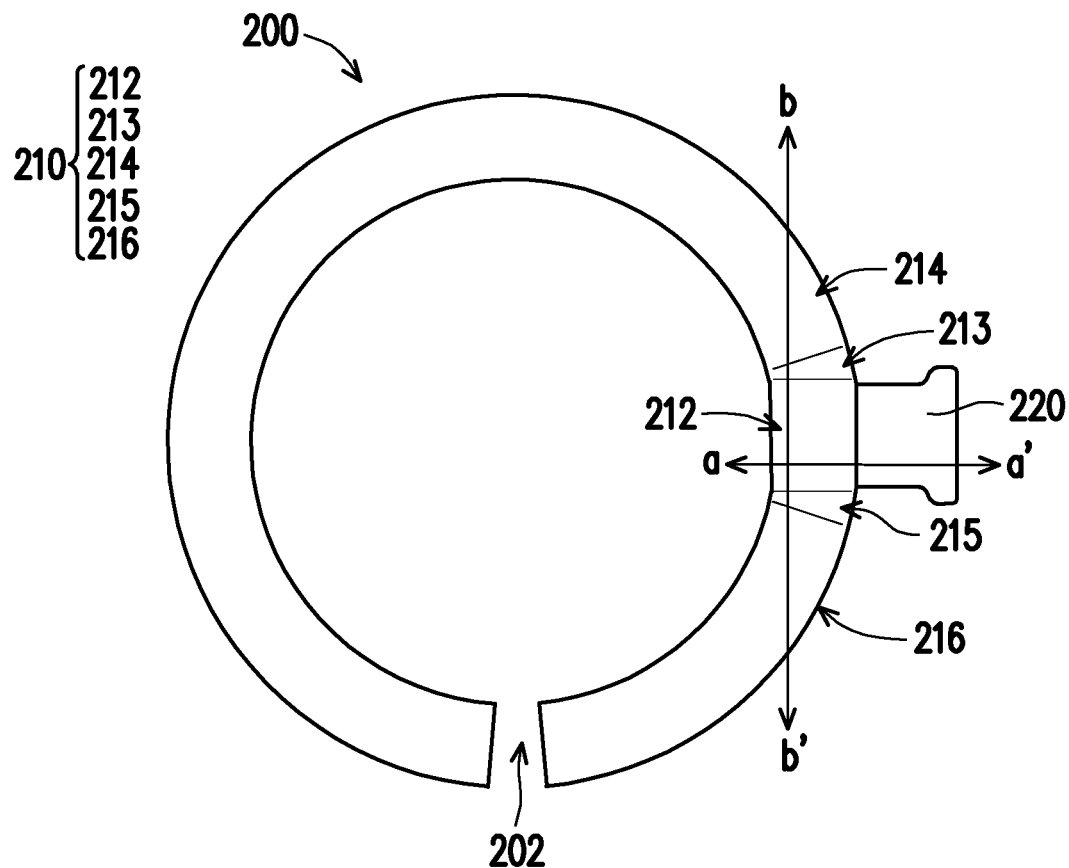
FIG. 3A is a schematic top view of a flexible display panel according to an embodiment of the disclosure.
Figure 3B:
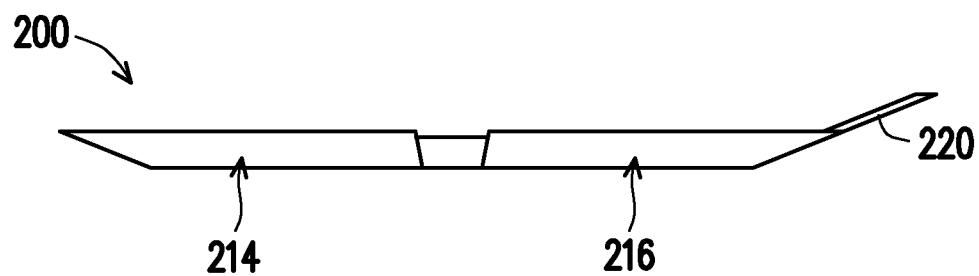
FIG. 3B is a schematic side view of a flexible display panel according to an embodiment of the disclosure.
Figure 3C:
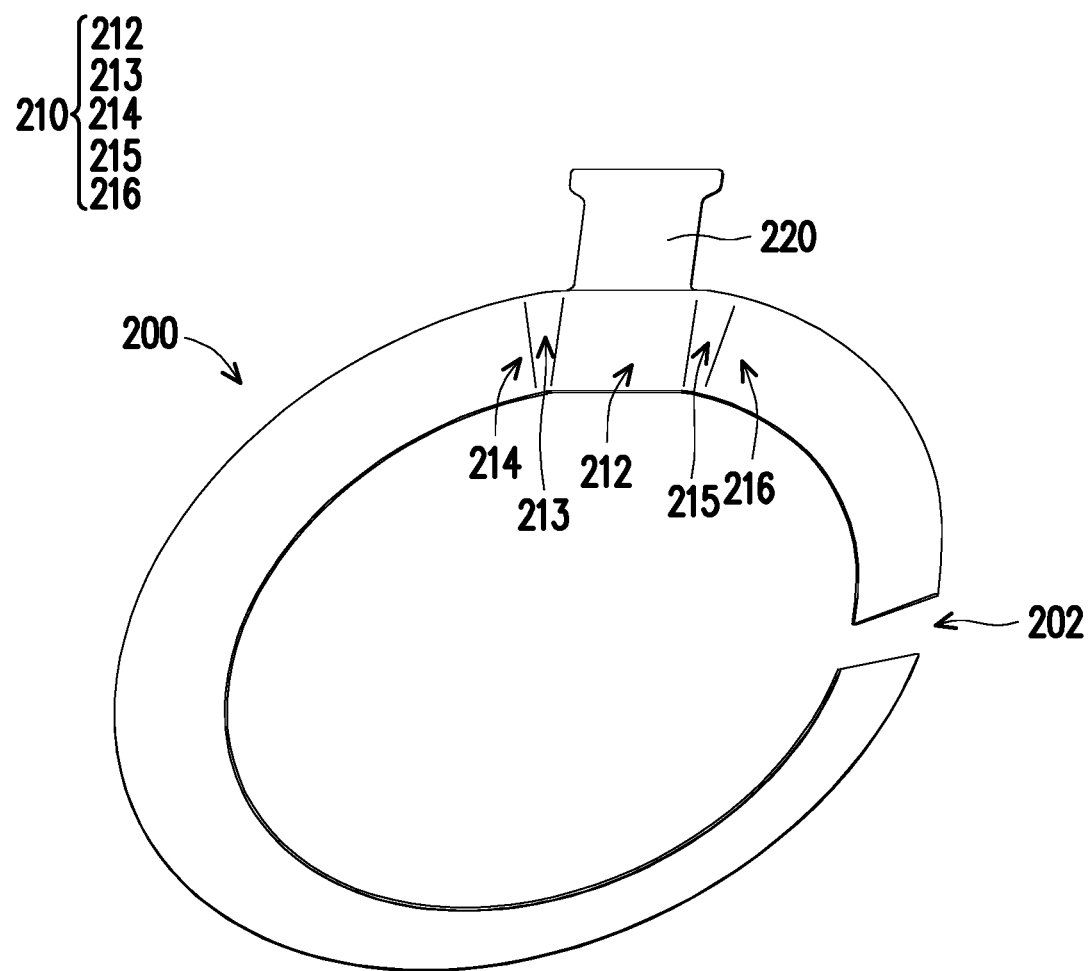
FIG. 3C is a schematic perspective view of a flexible display panel according to an embodiment of the disclosure.
Figure 4A:
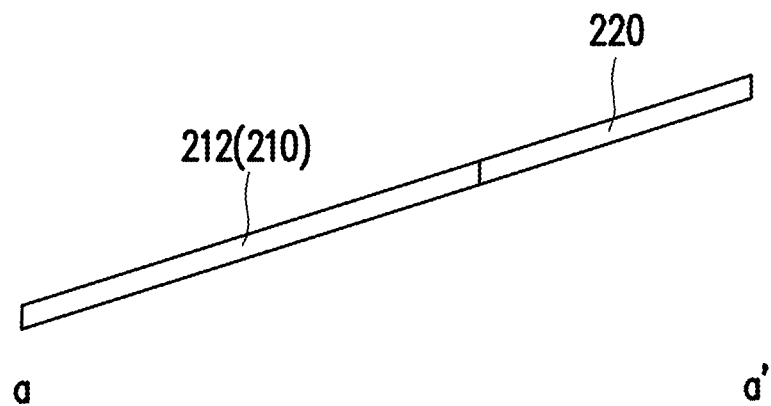
FIG. 4A is a schematic cross-sectional view along lines a-a' of FIG. 3A.
Figure 4B:
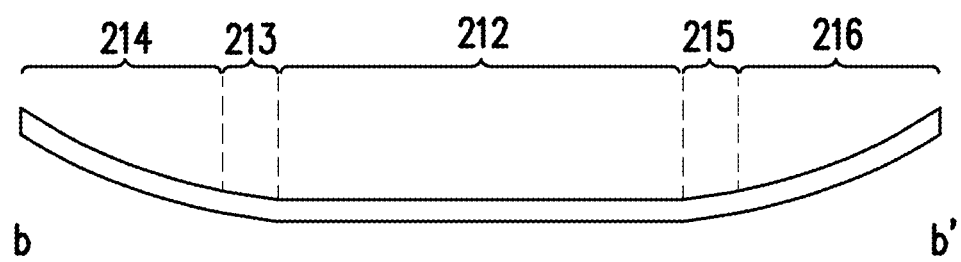
FIG. 4B is a schematic cross-sectional view along lines b-b' of FIG. 3A.

FIG. 3A is a schematic top view of a flexible display panel according to an embodiment of the disclosure. FIG. 3B is a schematic side view of a flexible display panel according to an embodiment of the disclosure. FIG. 3C is a schematic perspective view of a flexible display panel according to an embodiment of the disclosure. FIG. 4A is a schematic cross-sectional view along lines a-a' of FIG. 3A. FIG. 4B is a schematic cross-sectional view along lines b-b' of FIG. 3A.

Please refer to FIG. 3A to FIG. 4B. A flexible display panel 200 includes a display area 210 and a pin bonding area 220. The display area 210 is annular in shape. In the embodiment, the display area 210 is an annular shape which includes a second notch 202, but the disclosure is not limited hereto. In other embodiments, the display area 210 is a closed annular shape. The display area 210 includes a second plane portion 212, a first transition portion 213, a third curved plane portion 214, a second transition portion 215, and a fourth curved plane portion 216. The second notch 202 is located between the third curved plane portion 214 and the fourth curved plane portion 216.

The first transition portion 213 is connected between the third curved plane portion 214 and the second plane portion 212. The first transition portion 213 is flatter than the third curved plane portion 214. In other words, the first transition portion 213 may serve as a buffer portion between the third curved plane portion 214 and the second plane portion 212 to avoid a large curvature change between the third curved plane portion 214 and the second plane portion 212.

The second transition portion 215 is connected between the fourth curved plane portion 216 and the second plane portion 212. The second transition portion 215 is flatter than the fourth curved plane portion 216. In other words, the second transition portion 215 may serve as a buffer portion between the fourth curved plane portion 216 and the second plane portion 212 to reduce a large curvature change between the fourth curved plane portion 216 and the second plane portion 212.

In some embodiments, the thickness of the flexible display panel 200 is very thin (e.g., about 100 microns). The third curved plane portion 214 and the fourth curved plane portion 216 may be regarded as cubic curved planes. For example, the third curved plane portion 214 and the fourth curved plane portion 216 are each a partial conical plane of the same virtual cone (not shown). The virtual cone is wide at the top and narrow at the bottom. In some embodiments, the first transition portion 213 and the second transition portion 215 may also be regarded as cubic planes. For example, the first transition portion 213 and the second transition portion 215 are each a partial conical plane of another virtual cone (not shown). The other virtual cone is wide at the top and narrow at the bottom. In some embodiments, the curvatures of the first transition portion 213 and the second transition portion 215 are less than the curvatures of the third curved plane portion 214 and the fourth curved plane portion 216.

In some embodiments, a flexible display panel 200 is, for example, a micro light emitting diode display panel, an organic light emitting diode display panel, a plasma display panel, or other suitable display panels. In some embodiments, the display area 210 of the flexible display panel 200 is annular (or a notched annular shape). The second plane portion 212, the first transition portion 213, the third curved plane portion 214, the second transition portion 215, and the fourth curved plane portion 216 of the flexible display panel 200 all have a display function.

In some embodiments, the pin bonding area 220 of the flexible display panel 200 includes multiple signal lines (not shown) and bonding pads (not shown) electrically connected to the signal lines. The signal lines are electrically connected to a display component (not shown) in the display area 210.

The pin bonding area 220 of the flexible display panel 200 is connected to the display area 210.

Figure 5A:
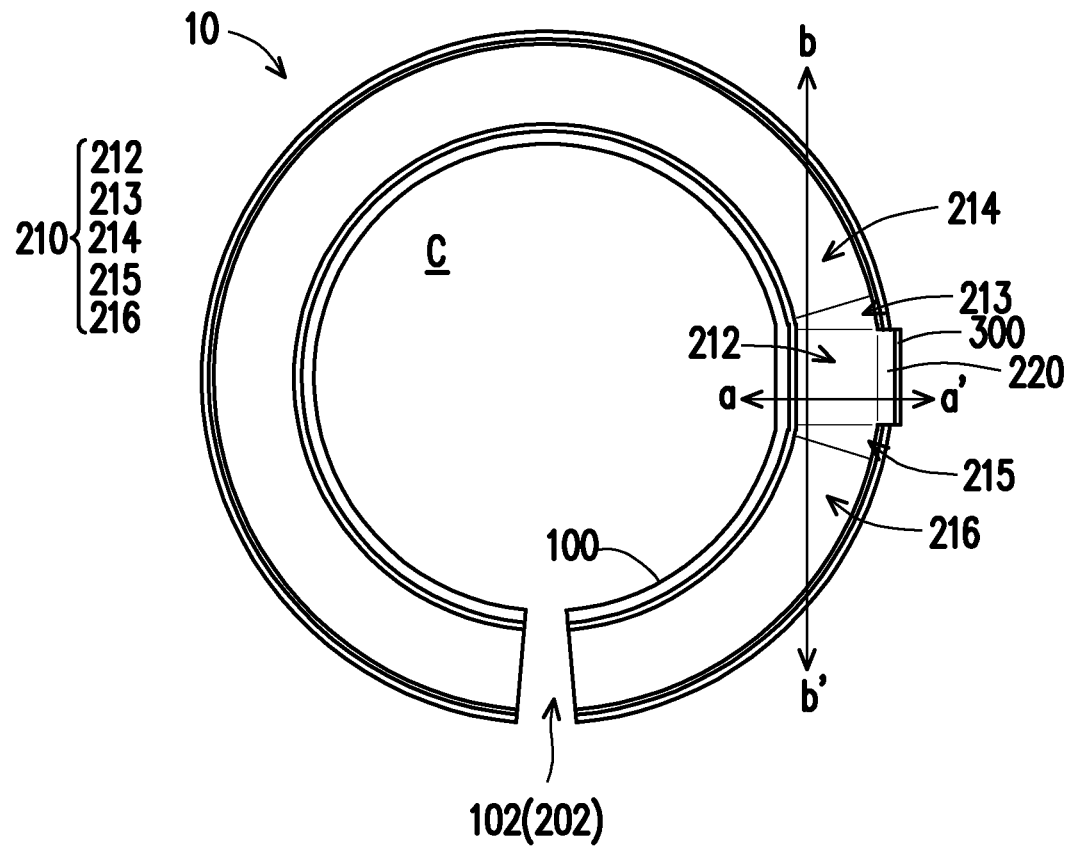
FIG. 5A is a schematic top view of a display device according to an embodiment of the disclosure.
Figure 5B:
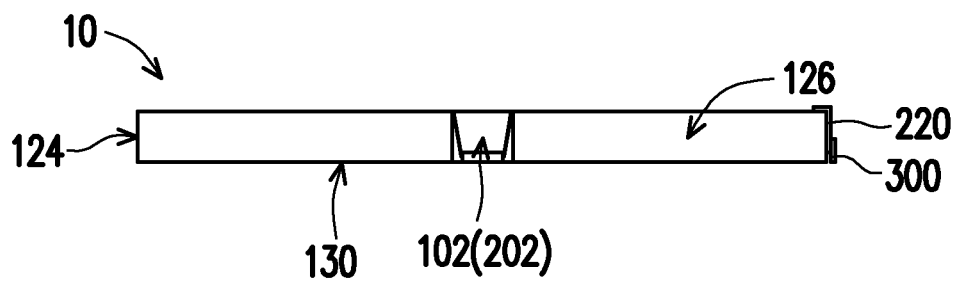
FIG. 5B is a schematic side view of a display device according to an embodiment of the disclosure.
Figure 5C:
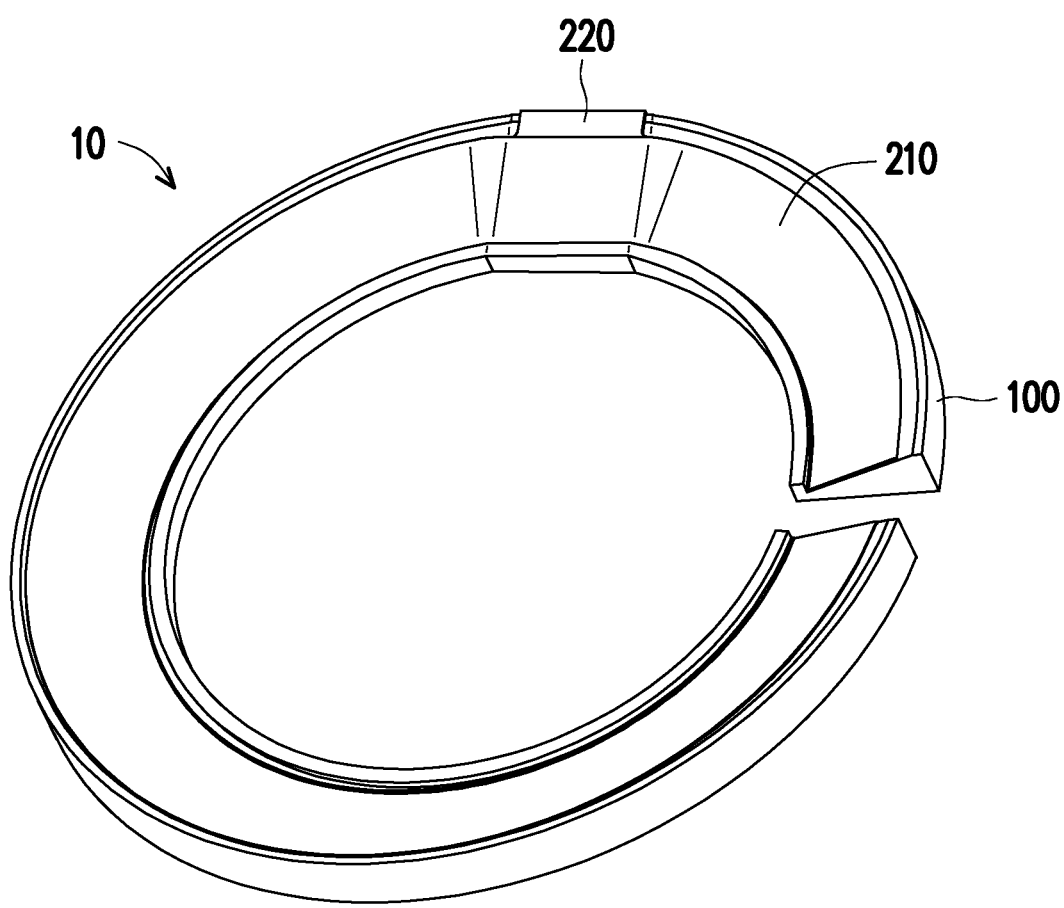
FIG. 5C is a schematic perspective view of a display device according to an embodiment of the disclosure.
Figure 6A:
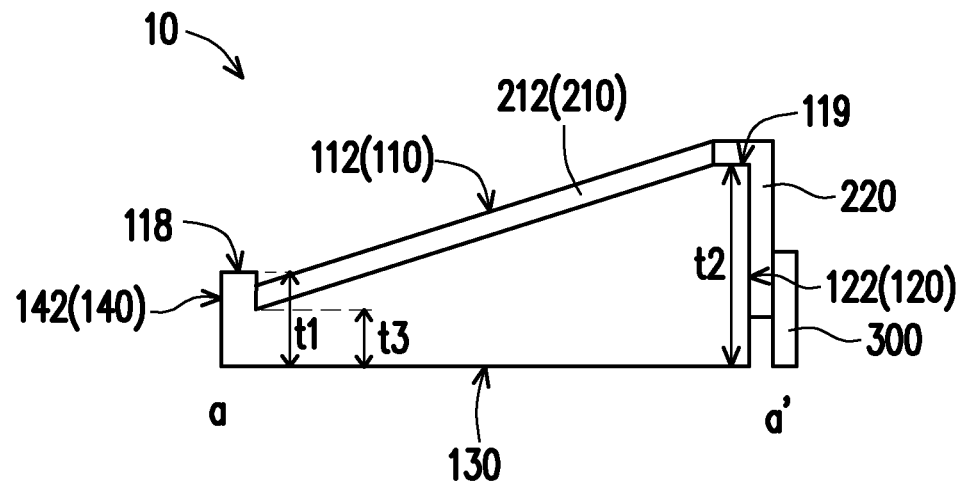
FIG. 6A is a schematic cross-sectional view along lines a-a' of FIG. 5A.
Figure 6B:
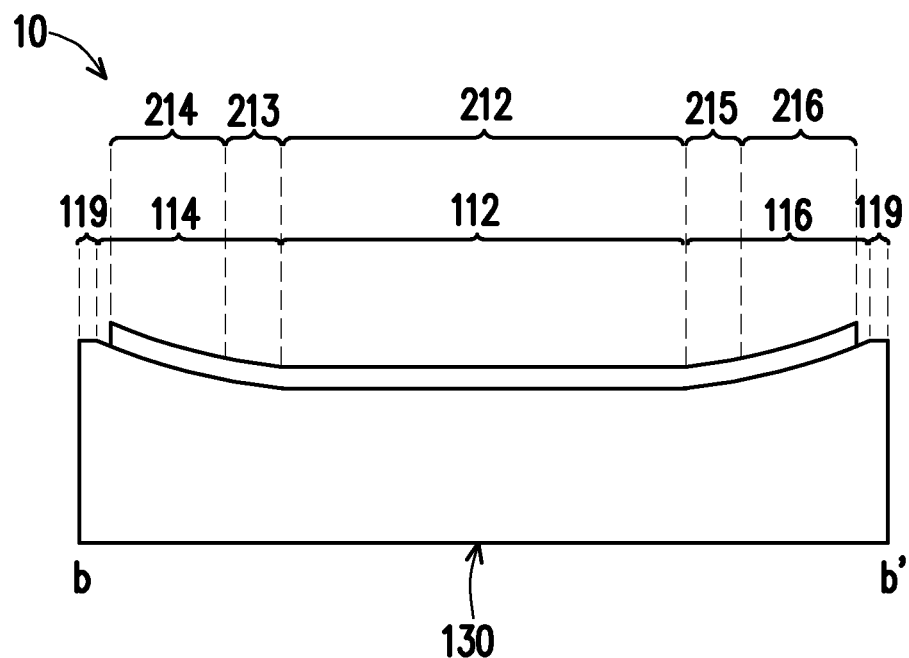
FIG. 6B is a schematic cross-sectional view along lines b-b' of FIG. 5A.

FIG. 5A is a schematic top view of a display device according to an embodiment of the disclosure. FIG. 5B is a schematic side view of a display device according to an embodiment of the disclosure. FIG. 5C is a schematic perspective view of a display device according to an embodiment of the disclosure. FIG. 6A is a schematic cross-sectional view along lines a-a' of FIG. 5A. FIG. 6B is a schematic cross-sectional view along lines b-b' of FIG. 5A.

Please to FIG. 5A to FIG. 6B. The display area 210 of the flexible display panel 200 of FIG. 3A to FIG. 4B is disposed above the front side 110 of the bezel 100 of FIG. 1A to FIG. 2B. The first notch 102 of the bezel 100 overlaps the second notch 202 of the display area 210 of the flexible display panel 200.

In some embodiments, the display area 210 of the flexible display panel 200 is disposed between the blocking wall 118 of the bezel 100 and the outer side 120 of the bezel 100, and selectively covers or does not cover the annular plane 119. The second plane portion 212 of the display area 210 is disposed above the first plane portion 112 of the front side 110 of the bezel 100. The first transition portion 213 and the third curved plane portion 214 of the display area 210 are disposed above the first curved plane portion 114 of the front side 110 of the bezel 100. The second transition portion 215 and the fourth curved plane portion 216 of the display area 210 are disposed above the second curved plane portion 116 of the front side 110 of the bezel 100. In the embodiment, the first transition portion 213 and the second transition portion 215 do not overlap the first plane portion 112, but the disclosure is not limited hereto. In other embodiments, the first transition portion 213 and the second transition portion 215 partially overlap the first plane portion 112.

The pin bonding area 220 of the flexible display panel 200 is bent from the front side 110 of the bezel 100 to the outer side 120 of the bezel 100, thereby preventing the pin bonding area 220 from adversely affecting the visual effect of a display device 10. In some embodiments, the pin bonding area 220 is bent from the front side 110 of the bezel 100 to the back side 130 of the bezel 100 along the outer side 120 of the bezel 100. In some embodiments, the pin bonding area 220 extends along the first plane portion 112 of the front side 110 of the bezel 100, the annular plane 119 of the front side 110, and the first outer plane portion 122 of the outer side 120 to the back side 130 of the bezel 100. A flexible circuit board 300 is connected to the pin bonding area 220. In the embodiment, the flexible circuit board 300 is connected to the pin bonding area 220 located on the outer side 120 of the bezel 100. In other embodiments, the pin bonding area 220 is bent to the back side 130 of the bezel 100, and the flexible circuit board 300 is connected to the pin bonding area 220 located on the back side 130 of the bezel 100.

Based on the above, the first plane portion 112, the annular plane 119, and the first outer plane portion 122 help to prevent the signal lines in the pin bonding area 220 from being broken after being bent due to the curvature of the bezel 100.

Figure 7:
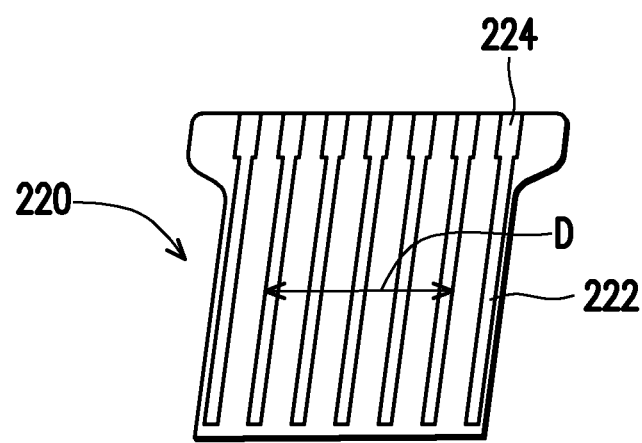
FIG. 7 is a schematic perspective view of a pin bonding area of a flexible display panel according to an embodiment of the disclosure.

FIG. 7 is a schematic perspective view of a pin bonding area of a flexible display panel according to an embodiment of the disclosure. For example, FIG. 7 is an enlarged schematic view of the pin bonding area 220 of the flexible display panel 200 of FIG. 3A to FIG. 4B.

Please refer to FIG. 7. The pin bonding area 220 of the flexible display panel includes multiple signal lines 222 and multiple pads 224. The signal line 222 electrically connects the pad 224 to the display component (not shown) in the display area 210. In some embodiments, after bending the pin bonding area 220 of the flexible display panel to the outer side 120 of the bezel 100 (please refer to FIG. 5A to FIG. 6B), a flexible circuit board (not shown) or other electronic components are connected to the pad 224 located on the outer side 120 of the bezel 100. In other embodiments, after bending the pin bonding area 220 along the outer side 120 of the bezel 100 to the back side 130 of the bezel 100, the flexible circuit board (not shown) or the other electronic components is connected to the pad 224 located on the back side 130 of the bezel 100.

In the embodiment, the pin bonding area 220 of the flexible display panel is bent to the first outer plane portion 122 (or further bent to the back side 130) along the first plane portion 112 and the annular plane 119 of the front side 110 of the bezel 100. Since the first plane portion 112, the annular plane 119, and the first outer plane portion 122 are planes, the pin bonding area 220 of the flexible display panel is not bent in a horizontal direction D, thereby allowing the signal line 222 to be freed of the problem of having an inconsistent stretched length after bending and preventing the signal line 222 from breaking.

Figure 8A:
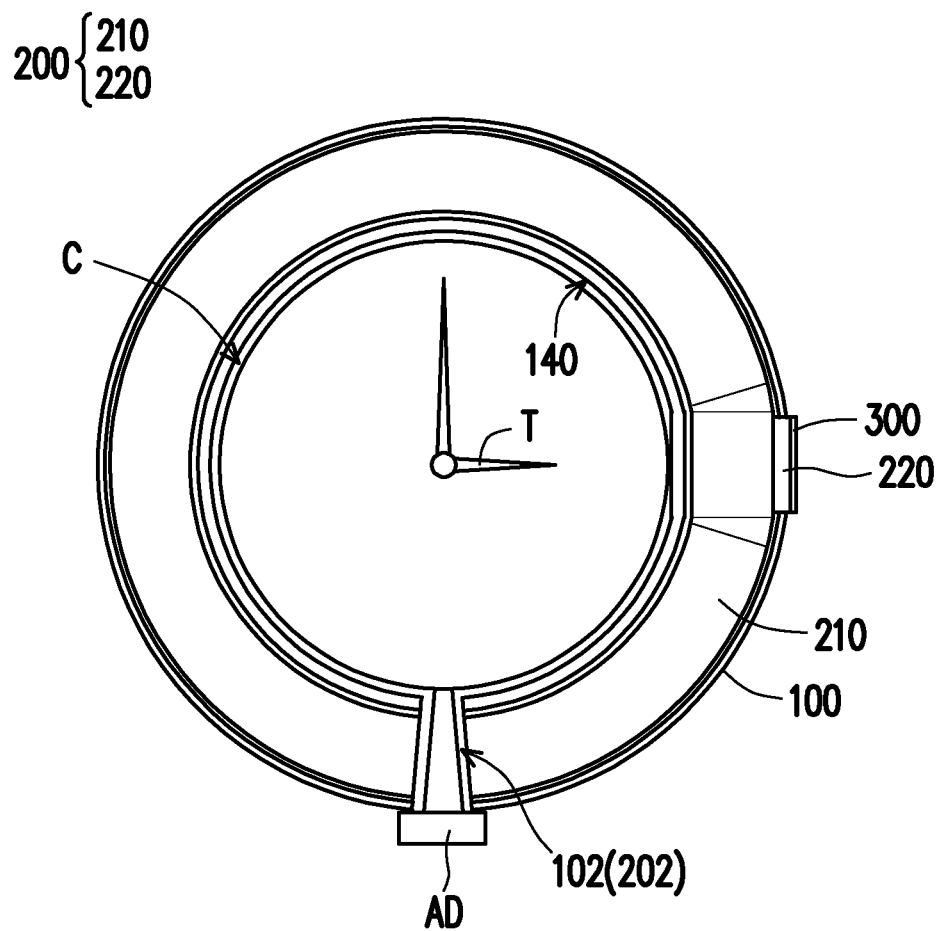
FIG. 8A is a schematic top view of a display device according to an embodiment of the disclosure.
Figure 8B:
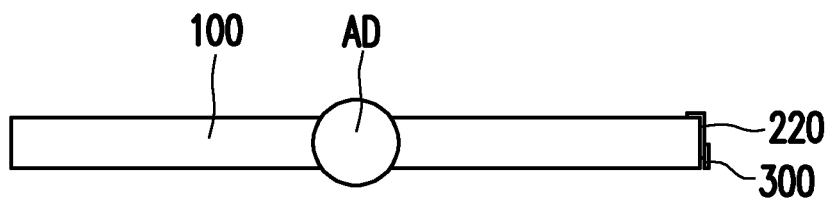
FIG. 8B is a schematic side view of a display device according to an embodiment of the disclosure.

FIG. 8A is a schematic top view of a display device according to an embodiment of the disclosure. FIG. 8B is a schematic side view of a display device according to an embodiment of the disclosure. It should be noted here that the embodiments of FIG. 8A and FIG. 8B use the element numerals and part of the contents of the embodiments of FIG. 1A to FIG. 7. The same or similar reference numerals are used to denote the same or similar elements, and the description of the same technical content is omitted. For the description of the omitted part, reference may be made to the foregoing embodiments and are not be repeated here.

Please refer to FIG. 8A and FIG. 8B. In the embodiment, the display device further includes a pointer T and a pointer adjustment device AD. The pointer T is disposed in the accommodating space C of the inner side 140 of the bezel 100. The pointer T is, for example, the hour hand and the minute hand of the mechanical watch. In some embodiments, the pointer T also includes the second hand of the mechanical watch. The pointer adjustment device AD is disposed in the first notch 102 of the bezel 100. In some embodiments, the pointer adjustment device AD is further disposed in the second notch 202 of the flexible display panel 200. The pointer adjustment device AD is adapted to adjusting the pointer T.

In some embodiments, the picture displayed by the flexible display panel 200 may be used in conjunction with the pointer T. For example, the flexible display panel 200 displays the numbers on the watch, and the pointer T points to the corresponding time.

What is claimed is:
1. A display device, comprising:
  a bezel, annular in shape;
  a flexible display panel, comprising:
    a display area, disposed above a front side of the bezel, and being annular in shape; and
    a pin bonding area, connected to the display area, and bent from the front side of the bezel to an outer side of the bezel, wherein the front side of the bezel comprises a first curved plane portion, a first plane portion and a second curved plane portion, wherein the first plane portion is connected to the first curved plane portion and connected between the first curved plane portion and the second curved plane portion, wherein the display area is disposed above the first curved plane portion and the first plane portion, wherein the first curved plane portion, the first plane portion, and the second curved plane portion surround an accommodating space of an inner side of the bezel, wherein the display area is located between the inner side of the bezel and the outer side of the bezel, and wherein the display area is located between the accommodating space and the outer side of the bezel.

2. The display device according to claim 1, wherein the front side of the bezel has an annular plane near the outer side, and the annular plane surrounds the first plane portion, the first curved plane portion, and the second curved plane portion.

3. The display device according to claim 1, wherein the display area comprises a third curved plane portion and a second plane portion, the third curved plane portion is disposed above the first curved plane portion, and the second plane portion is disposed above the first plane portion.

4. The display device according to claim 3, wherein the display area further comprises a first transition portion, the first transition portion is connected between the third curved plane portion and the second plane portion, and the first transition portion is flatter than the third curved plane portion.

5. The display device according to claim 4, wherein the display area further comprises a fourth curved plane portion and a second transition portion, the second transition portion is connected between the fourth curved plane portion and the second plane portion, and the second transition portion is flatter than the fourth curved plane portion.

6. The display device according to claim 1, further comprising:
a pointer, disposed in the accommodating space.

7. The display device according to claim 1, wherein the outer side of the bezel comprises a first outer curved plane portion and a first outer plane portion, the first outer plane portion is connected to the first outer curved plane portion, and the pin bonding area is bent from the first plane portion to the first outer plane portion.

8. The display device according to claim 1, wherein the first curved plane portion comprises a cubic curved plane.

9. The display device according to claim 1, wherein a thickness of the inner side of the bezel is less than a thickness of the outer side of the bezel.

10. The display device according to claim 9, wherein the front side of the bezel has a blocking wall near the inner side, and the display area is disposed between the blocking wall and the outer side of the bezel.

11. The display device according to claim 1, wherein the bezel comprises a first notch.

12. The display device according to claim 11, wherein the display area comprises a second notch, and the first notch overlaps the second notch.

13. The display device according to claim 12, further comprising a pointer adjustment device disposed in the first notch.

14. The display device according to claim 1, further comprising:
a flexible circuit board, connected to the pin bonding area.

* * * * *